(12) United States Patent
Yang

(10) Patent No.: US 8,288,246 B2
(45) Date of Patent: Oct. 16, 2012

(54) STRUCTURE COMBINING AN IC INTEGRATED SUBSTRATE AND A CARRIER, AND METHOD OF MANUFACTURING SUCH STRUCTURE

(75) Inventor: Chih-kuang Yang, Hsin-Chu (TW)

(73) Assignee: Princo Corp., Hsinchu (TW)

( * ) Notice: Subject to any disclaimer, the term of this patent is extended or adjusted under 35 U.S.C. 154(b) by 0 days.

(21) Appl. No.: 13/018,451

(22) Filed: Feb. 1, 2011

(65) Prior Publication Data

US 2011/0129964 A1 Jun. 2, 2011

Related U.S. Application Data

(62) Division of application No. 12/121,037, filed on May 15, 2008, now Pat. No. 7,947,573, which is a division of application No. 11/537,625, filed on Sep. 30, 2006.

(51) Int. Cl.
*H01L 21/304* (2006.01)
(52) U.S. Cl. ............... 438/455; 438/459; 257/E21.237
(58) Field of Classification Search ........... 438/455, 438/459; 257/E21.237
See application file for complete search history.

(56) References Cited

U.S. PATENT DOCUMENTS

| | | |
|---|---|---|
| 4,480,288 A | 10/1984 | Gazdik et al. |
| 4,812,191 A | 3/1989 | Ho et al. |
| 5,215,598 A | 6/1993 | Kouzuma et al. |
| 5,258,236 A | 11/1993 | Arjavalingam et al. |
| 5,856,229 A | 1/1999 | Sakaguchi et al. |
| 6,183,588 B1 | 2/2001 | Kelly et al. |
| 6,391,220 B1 | 5/2002 | Zhang et al. |
| 6,743,697 B2 | 6/2004 | Ravi |
| 2002/0115282 A1 | 8/2002 | Lin et al. |
| 2003/0219969 A1 | 11/2003 | Saito et al. |
| 2004/0140547 A1 | 7/2004 | Yamazaki et al. |
| 2005/0121771 A1 | 6/2005 | Lin et al. |
| 2006/0006545 A1 | 1/2006 | Wu et al. |
| 2006/0214306 A1 | 9/2006 | Yamazaki et al. |
| 2008/0042280 A1 | 2/2008 | Lin et al. |

FOREIGN PATENT DOCUMENTS

| | | |
|---|---|---|
| EP | 0494668 A2 | 7/1992 |
| EP | 1244143 | 9/2002 |
| EP | 1801870 A1 | 6/2007 |
| JP | 1993144974 | 6/1993 |
| JP | 2002009202 | 1/2002 |
| JP | 2005011839 | 1/2005 |
| JP | 20050166902 | 6/2005 |
| JP | 2006156863 | 6/2006 |
| KR | 20060012304 | 2/2006 |
| KR | 20060043282 | 5/2006 |
| WO | 2005036633 | 4/2005 |

*Primary Examiner* — Mary Wilczewski
*Assistant Examiner* — Toniae Thomas

(57) ABSTRACT

The present invention provides a structure combining an IC integrated substrate and a carrier, which comprises a carrier and an IC integrated substrate formed on the carrier. The IC integrated substrate has a first dielectric layer attached to the carrier. The materials of the carrier and the first dielectric layer are selected to prevent the IC integrated substrate from peeling off the carrier during processing and to allow the IC integrated substrate to naturally separate from the carrier after being cut, through the adhesion between the carrier and the first dielectric layer. The present invention also provides a method of manufacturing the above structure and a method of manufacturing electrical devices using the above structure.

12 Claims, 3 Drawing Sheets

STRUCTURE COMBINING AN IC INTEGRATED SUBSTRATE AND A CARRIER, AND METHOD OF MANUFACTURING SUCH STRUCTURE

CROSS REFERENCE TO RELATED APPLICATION

This is a division of a U.S. patent application Ser. No. 12/121,037, filed on May 15, 2008, U.S. Pat. No. 7,947,573 which is a division of a U.S. patent application Ser. No. 11/537,625, filed on Sep. 30, 2006.

BACKGROUND OF THE INVENTION a) Field of the Invention

The invention relates to a structure combining an IC integrated substrate and a carrier, and a method of manufacturing such structure.

b) Description of the Related Art

As information, communication, and consumer electronic products are moving in the trend of becoming lightweight, thin, short, compact, and multifunctional, the line width, line spacing, and size of chips are getting smaller and the chips require faster transmission speed. In response thereto, better packaging technology for electrically connecting the chips to the exterior is required to increase the wiring density. Therefore, the chip packaging technology transformed from through hole type to surface mount type, the lead frame went from connecting by gold wire to using bumps, and circuit boards started out from hard printed circuit boards (PCB) to flexible printed circuit boards (FPCB) and to multilayer thin-film substrates.

A typical six-layer PCB with BT material weighs about 4 grams and has a thickness of about 1 mm, and thus cannot be bent. An FPCB with a thickness of about 50 µm can only be made with two layers of interconnection. In contrast, a multilayer thin-film substrate with a thickness of about 50 µm can have six layers of interconnection and weighs about 0.21 grams in total, and therefore the multilayer thin-film substrate has the best flexibility and is the most compact. Moreover, in regard to the interconnection density, for PCB and FPCB, the minimum diameter of through holes is 50 µm, the minimum dimension of through hole bonding pads is 100 µm, and the minimum line width and line spacing is 25 µm, whereas for the multilayer thin-film substrate, the minimum diameter of through holes is 20 µm, the minimum dimension of through hole bonding pads is 25 µm, and the minimum line width and line spacing is 20 µm, and therefore the multilayer thin-film substrate greatly increases the interconnection density. The multilayer thin-film substrate, due to its flexibility, is especially suitable for products that have special limitation in size or have a structure with bending design.

In general, the aforementioned multilayer thin-film substrate is used as an IC packaging substrate, playing a conventional role of electrical signal transmission and interface connection. With requirements of the electronic products heading towards high functionality, high speed signal transmission, and high density circuitries, the multilayer thin-film substrate technology has a larger room for growth because the multilayer thin-film substrate has semiconductor devices with functionalities like capacitance and resistance, and thereby can greatly enhance its functionality. The semiconductor device is, for example, passive devices, driver ICs, and thin film transistors (TFT). This type of high functionality multilayer thin-film substrate is referred to as IC integrated substrate hereafter.

In photoelectric, electronic, and semiconductor industries, as the IC integrated substrate miniaturizes in size while it provides more and more functions, the level of precision required of the IC integrated substrate also rises. The manufacturing process of IC integrated substrate thus faces new challenges, especially in how to increase circuit density and/or how to combine different electronic devices to form a high functionality IC integrated substrate, both of which are important parts of industrial competitions. A key to manufacturing an IC integrated substrate is the size stability of the IC integrated substrate in the manufacturing process. A conventional solution is to manufacture the IC integrated substrate on a rigid carrier; in which the size stability of the carrier is used to increase the size stability of the IC integrate substrate during processing. However, a major issue in using this solution is the separation of the IC integrated substrate from the carrier after the fabrication of the IC integrated substrate is complete.

In U.S. Pat. No. 4,480,288, a double-sided thin, flexible circuitry is formed on an aluminum carrier, and then the aluminum carrier is removed by hydrochloric acid. In addition, U.S. Pat. No. 4,812,191 discloses a method of manufacturing a multilayer thin-film substrate comprising a multilayer interconnection structure by using a sacrificial substrate technique. In the method, a multilayer interconnection structure is formed on a carrier that has a coefficient of thermal expansion less than that of the structure, and then the temperature is elevated to perform curing, after which the temperature is lowered to generate sufficient tension between the carrier and the multilayer interconnection structure before the multilayer interconnection structure is separated from the carrier by adhering a support means to the multi-layer interconnection structure and by an acid-etching process.

U.S. Pat. No. 5,258,236 is about a method of separating a carrier and a multilayer thin-film substrate having a multilayer interconnection structure by laser ablation. Referring to FIG. 1, a polymer layer 2, a metal layer 3, and a multilayer interconnection structure 4 are sequentially formed on the transparent carrier 1. Ultraviolet light is then applied to the polymer layer 2 through the transparent carrier 1 in order to ablate the polymer 2, allowing the transparent carrier 1 to be separated from the rest of the structure.

However, the aforementioned separation methods are tedious and complex. Thus, a manufacturing method that fabricates an IC integrated substrate with high size-precision and separates the IC integrated substrate and a carrier without increasing the production cost is much needed.

SUMMARY OF THE INVENTION

It is an object of the invention to provide a structure combining an IC integrated substrate and a carrier, a method of manufacturing such structure, and a method of manufacturing electronic devices using such structure, wherein the IC integrated substrate separates from the carrier in an easy, fast, and low-cost way.

A structure combining an IC integrated substrate and a carrier according to one embodiment of the invention comprises: a carrier; and an IC integrated substrate formed on the carrier and having a first dielectric layer attached to the carrier.

A method of manufacturing a structure combining an IC integrated substrate and a carrier according to another embodiment of the invention comprises the steps of: providing a carrier; and forming an IC integrated substrate on the carrier, the IC integrated substrate having a first dielectric layer attached to the carrier.

A method of manufacturing electronic devices according to another embodiment of the invention comprises the steps of: providing a carrier; forming an IC integrated substrate on the carrier, the IC integrated substrate having a first dielectric layer attached to the carrier; and cutting at least one piece from the IC integrated substrate, so that each piece cut from the IC integrated substrate naturally separates from the carrier to form an electronic device.

In the aforementioned structure and manufacturing methods, the materials of the carrier and the first dielectric layer can be selected to obtain an adhesion between the IC integrated substrate and the carrier, by which the IC integrated substrate is prevented from peeling off the carrier during processing but naturally separates from the carrier after a cutting process. In the invention, "natural separation" refers to the separating of the IC integrated substrate and the carrier with no or little external force applied and without damaging their structures; the little external force is, for example, sticking by tape, clamping by fixtures, vacuum suction, or the alike.

Moreover, the IC integrated substrate mentioned in the invention is different from the multilayer thin-film substrate used in conventional packaging process. The IC integrated substrate of the invention can have a multilayer interconnection structure for electrical connection, or at least one semiconductor device such as passive devices, electronic drivers, TFT devices, other electronic devices, or any combination thereof.

With the technical means of the invention, the IC integrated substrate and the carrier can be separated, according to the invention, by an easy, fast, and low-cost way in comparison to the conventional technology wherein complex methods like solvent and laser are used to separate a multilayer thin-film substrate and a carrier. An electronic device comprising a multilayer interconnection structure, at least one semiconductor device, or a combination thereof is thus manufactured.

DETAILED DESCRIPTION OF THE INVENTION

Figure 1:
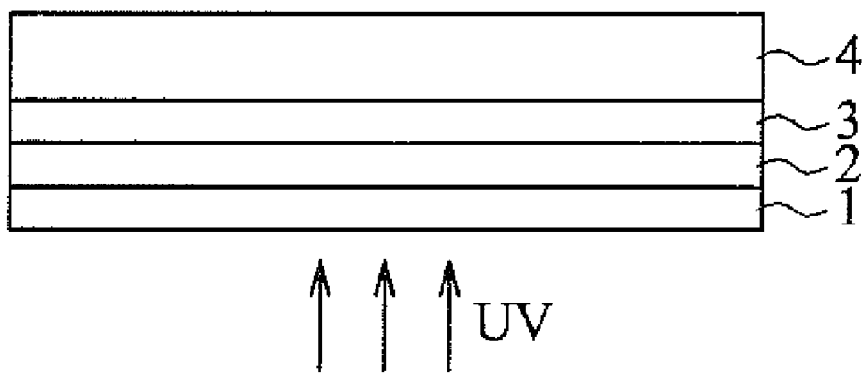
FIG. 1 illustrates a conventional method of separating a carrier and an electronic device by laser ablation.

The preferred embodiments of a structure combining an IC integrated substrate and a carrier and a method of manufacturing such structure according to the invention will be described in detail with reference to the drawings, in which like reference numerals denote like elements.

Figure 2:
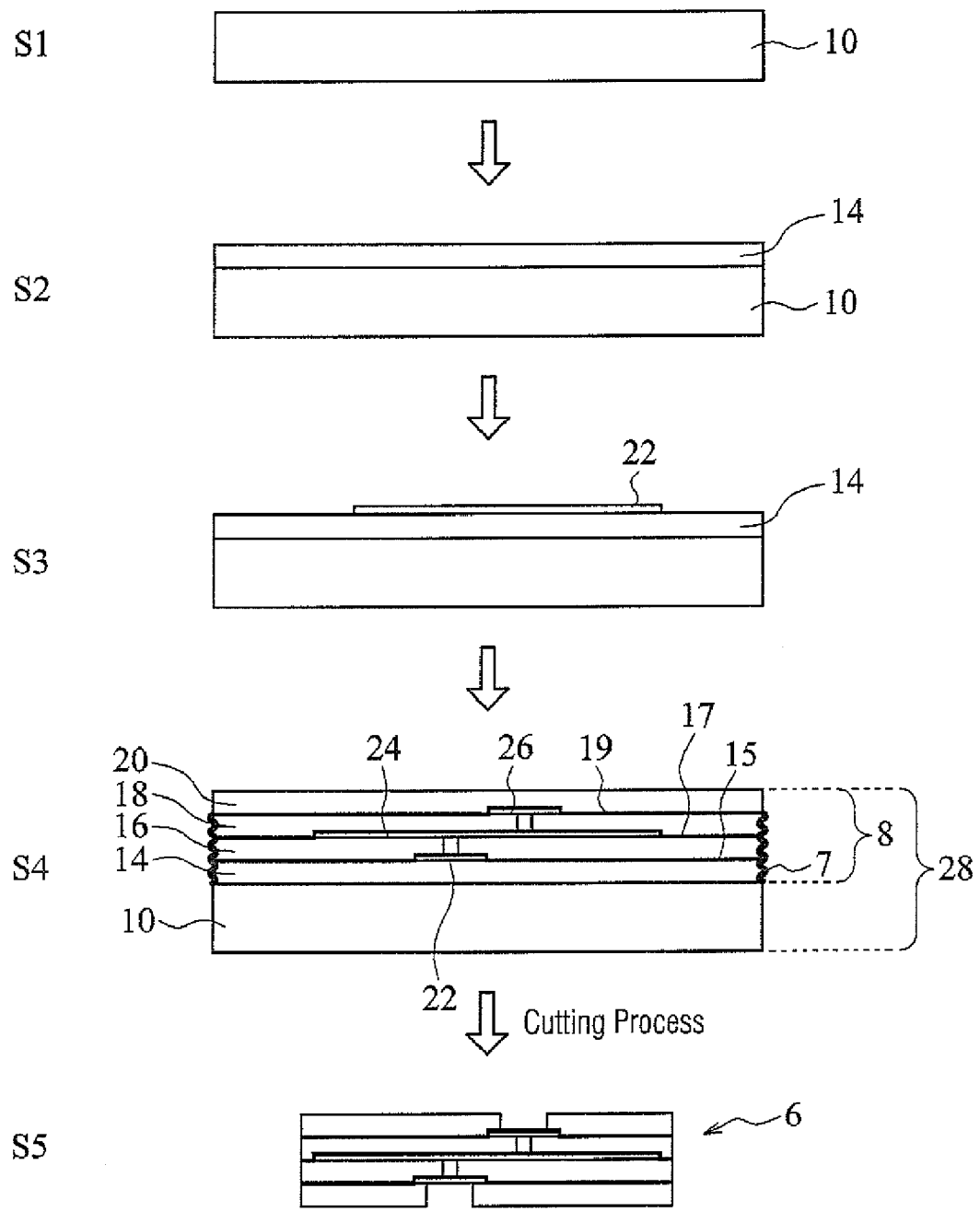
FIG. 2 is a flow chart illustrating a method of manufacturing an electronic device, including the manufacturing of a structure combining a carrier and an IC integrated substrate having a multilayer interconnection structure, according to an embodiment of the invention.

FIG. 2 is a flow chart illustrating a method of manufacturing an electronic device 6 according to an embodiment of the invention; the flow chart also includes the manufacturing of a structure 28 combining an IC integrated substrate 8 and a carrier 10. The IC integrated substrate 8 shown in this embodiment has a multilayer interconnection structure and is a double-sided substrate, which means its front side and backside are both electrically connected to the exterior. For this double-sided substrate, the front side electrically connects to the backside, but the multilayer interconnection structure may be of other types of interconnections such as interconnecting in multiple places on one surface, or in other conditions. Furthermore, the number of layers in the multilayer interconnection structure is not limited and can be adjusted according to different applications.

In Step S1 of this embodiment, the carrier 10 is an eight-inch silicon wafer, but obviously it can be a substrate or silicon wafer or the like, of any size.

Steps S2 to S4 of FIG. 2 are steps of forming on the carrier 10 the IC integrated substrate 8 having a multilayer interconnection structure. First, a first dielectric layer 14 is formed on the carrier 10 in Step S2. Specifically, the first dielectric layer 14 of the IC integrated substrate 8, as shown in FIG. 2, is spin coated on the carrier 10 without any adhesive treatment performed to the interface between the carrier 10 and the first dielectric layer 14. Subsequently in Step S3 and S4, metal layers 22, 24, and 26 and dielectric layers 16, 18, and 20 are alternately, sequentially formed (in the order of 22, 16, 24, 18, 26, 20) on the first dielectric layer 14 to form the IC integrated substrate 8 having a multilayer interconnection structure. And thus the structure 28 combining the IC integrated substrate 8 and the carrier 10 is manufactured.

In the aforementioned structure 28, the materials of the IC integrated substrate 8 and the carrier 10 are selected such that adhesion (without adhesion-enhancement) existing between the two prevents the IC integrated substrate 8 from peeling off the carrier 10 due to the stress generated during processing and allows the IC integrated substrate 8 to naturally separate from the carrier 10 at a cutting process (Step S5, which will be described later). For this embodiment and description of other embodiments hereinafter, "natural separation" refers to the separating of the IC integrated substrate and the carrier with no or little external force applied and without damaging their structures. For example, the two are said to be naturally separated if they can be separated by sticking with tape, clamping with fixtures, vacuum suction, etc.

In addition, residual dielectric layer material 7 attached to the outer periphery of the carrier 10 and the IC integrated substrate 8 also acts to fix and bond the two, the residual dielectric layer material 7 being the remaining material of dielectric materials on the edge of the carrier 10 that are spin coated to form dielectric layers. According to this embodiment, the dielectric layers 14, 16, 18, and 20 are polyimides (PI) (DuPont PI-2611) with low dielectric constants (less than 4) and a thickness of 8 μm; the top metal layer 26 and the bottom metal layer 22 are under bump metal (UBM) with Cr/Cu/Ni/Au structure for subsequent electrical connection to solder balls; and the middle metal layer 24 is multilayer metal wires of Cr/Cu/Cr. Each metal layer may be of a composition other than the aforementioned metal layer and appropriate metal layers can be selected for different applications.

Another embodiment of the invention includes performing an adhesion-diminishing treatment to the interface between the first dielectric layer 14 and the carrier 10 before spin coating the first dielectric layer 14 on the carrier 10 in Step S2 if the adhesion between the two is strong. For example, if both the first dielectric layer 14 and the carrier 10 are PIs, using a Silane-based material can weaken the interfacial adhesion between the two. The dielectric layer 14 is then spin coated on the carrier 10 thereafter. It is to be noted that whether the aforementioned adhesion-diminishing treatment is necessary and which treatment method to use can be determined based on the material selected for the first dielectric layer 14 and the carrier 10. The diminished adhesion between the carrier 10 and the first dielectric layer 14 acts to prevent the first dielectric layer 14 from peeling off the carrier 10 due to the stress generated during processing and to allow the first dielectric layer 14 to naturally separate from the carrier 10 at a cutting process (Step S5, which will be described later). In addition, the residual dielectric layer material 7 attached to the outer periphery of the carrier 10 and the IC integrated substrate 8 fixes and bonds the two. More precisely, the aforementioned residual dielectric layer material 7 is the excess from materials on the edge of the carrier 10 that are used to form a plurality of dielectric layers in the IC integrated substrate 8 and, is left on the outer periphery of the carrier 10 and the IC integrated substrate 8 when no edge-washing is performed.

Moreover, an adhesion-enhancing treatment can be used to strengthen the adhesion between the aforementioned dielectric layers 14, 16, 18, and 20 in the IC integrated substrate 8, respectively forming adhesion enhanced regions 15, 17, and 19 as shown in bold lines in FIG. 2. The adhesion-enhancing treatment described herein and in embodiments hereafter can be achieved by using the surface characteristic of dielectric layers or by increasing the surface energy, e.g. plasma treating the dielectric layers with $O_2$ or Ar. Also, conductive through holes, which penetrate dielectric layers 16 and 18, can be formed by etching or laser drilling the IC integrated substrate 8, thereby electrically connecting the metal interconnections 22, 24, and 26.

Lastly, as shown in Step 5 in FIG. 2, at least one piece is cut from the IC integrated substrate 8 on the carrier 10 at appropriate places, and since the adhesion between the IC integrated substrate 8 and the carrier 10 is weak, each piece cut from the IC integrated substrate 8 naturally separates from the carrier 10 to form the electronic device 6 having a multilayer interconnection structure. For example, the two can be easily separated through vacuum suction, clamping with fixtures, or sticking with tape. In comparison to the conventional technology wherein complex methods like solvent and laser are used to separate a multilayer thin-film substrate from a carrier to form an electronic device, the IC integrated substrate and the carrier in this embodiment are separated with this simple, fast, and low-cost method to manufacture a high size-precision, thin, and flexible electronic device having a multilayer interconnection structure. Moreover, after the cutting process, conductive through holes can be formed by etching or laser drilling holes through the top dielectric layer and the bottom dielectric layer of the electronic device 6, respectively, to establish electrical connections to the exterior.

Figure 3:
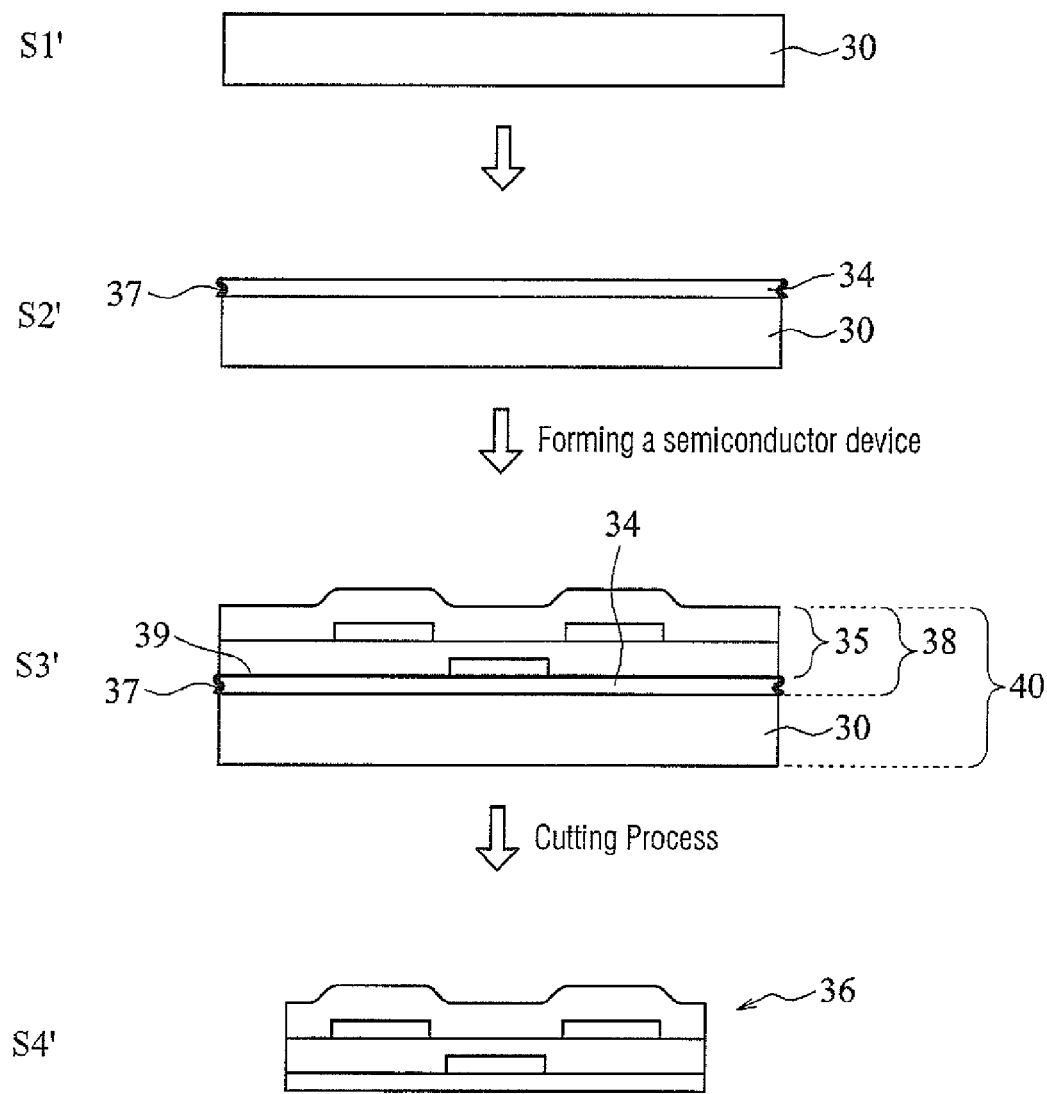
FIG. 3 is a flow chart illustrating a method of manufacturing an electronic device, including the manufacturing of a structure combining a carrier and an IC integrated substrate having a multilayer interconnection structure, according to another embodiment of the invention.

FIG. 3 is a flow chart illustrating a method of manufacturing an electronic device 36, which includes the manufacturing of a structure 40 combining an IC integrated substrate 38 and a carrier 30, according to another embodiment of the invention. The IC integrated substrate 38 used as an illustration in this embodiment includes at least one semiconductor device 35; the semiconductor device can be passive devices, electronic drivers, TFT devices, other electronic devices, or any combination thereof. It is to be noted that although FIG. 3 only illustrates an IC integrated substrate having a semiconductor, an IC integrated substrate may include a large number of semiconductor devices, and even thousands of electronic devices may be fabricated by cutting the substrate in subsequent processes. The structure of the IC integrated substrate is simplified herein for easy illustration and description purposes.

For this embodiment, an eight-inch silicon wafer is used as the carrier 30 in Step S1'; however, obviously the carrier can be a substrate or silicon wafer of any size.

Steps S2' and S3' shown in FIG. 3 are steps for forming the IC integrated substrate 38 having at least one semiconductor device on the carrier 30. First, a first dielectric layer 34 is formed on the carrier in Step 2'. More precisely, the forming step, in which the first dielectric layer 34 of the IC integrated substrate 38 is spin coated on the carrier 30, is carried out without any adhesive treatment. Subsequently, at least one semiconductor device 35 is formed on the first dielectric layer 34 in Step S3' to form the IC integrated substrate 38. The materials of the carrier 30 and the first dielectric layer 34 are selected to obtain an adhesion between the two which prevents the IC integrated substrate 38 from peeling off the carrier 30 due to the stress generated during processing and at the same time allows the IC integrated substrate 38 to naturally separate from the carrier 30 after a cutting process (Step S4', which will be described later). In addition, residual dielectric layer material 37 (shown in bold wavy lines in FIG. 3) attached to the outer periphery of the carrier 30 and the IC integrated substrate 38 acts to fix and bond the two, the residual dielectric layer material 37 being the dielectric material on the edge of the carrier 30 that is used to form the first dielectric layer 34. In this embodiment, the dielectric layer 34 is a polyimide (Dupont, PI-2611) with a low-dielectric constant (less than 4).

In another embodiment of Step S2', an adhesion-diminishing treatment is performed before spin coating the first dielectric layer 34 on the carrier 30 if the adhesion between the two is strong. For example, if both the first dielectric layer 34 and the carrier 30 are PIs, a Silane-based material can be used to reduce the interfacial adhesion therebetween before spin coating the first dielectric layer 34 on the carrier 30. It is to be noted that whether the adhesion-diminishing treatment is necessary and which method should be used for the treatment can be determined based on the materials selected for the first dielectric layer 34 and the carrier 30. The diminished adhesion between the first dielectric layer 34 and the carrier 30 prevents the peeling of the IC integrated substrate 38 from the carrier 30 due to the stress generated during processing but allows natural separation of the IC integrated substrate 38 and the carrier 30 at a cutting process (Step S4', which will be described later). In addition, the residual dielectric layer material 37 attached to the outer periphery of the carrier 30 and the first dielectric layer 34 fixes and bonds the two, and since the residual dielectric layer material 37 is the excess of the materials on the edge of the carrier 30 that are used to from the first dielectric layer 34, it remains at the outer periphery of the carrier 30 and the IC integrated substrate 38 if no edge-washing is performed.

Moreover, the adhesion between the dielectric layer 34 and the semiconductor device 35 can be strengthened by an adhesion-enhancing treatment to form an adhesion-enhanced region 39 as shown in bold line in FIG. 3. Also, the IC integrated substrate 38 can be etched or laser drilled, whereby the dielectric layer and the insulating layer of the semiconductor device are penetrated to form conductive through holes that can be used with metal interconnections to electrically connect the semiconductor devices to one another or to electrically connect the semiconductor device to the exterior.

Last, as shown in Step S4' in FIG. 3, at least one piece is cut from the IC integrated substrate 38 on the carrier 30 at appropriate places, since the adhesion between the IC integrated substrate 38 and the carrier is weak, each piece cut from the IC integrated substrate 38 naturally separates from the carrier 30, forming the electronic device 36. The separation method can be, for example, vacuum suction, clamping by fixtures, or sticking by tape. In comparison to the conventional technology wherein complex methods like solvent and laser are used to separate an IC integrated substrate from a carrier to form an electronic device, this embodiment uses this easy, fast, and low-cost method to achieve the separation, thereby manufacturing a high size-precision, thin, and flexible electronic device having at least one semiconductor device.

It is to be noted that in the invention, the carrier can be any solid material, including glass, ceramic, silicon wafer, sapphire substrate, gallium arsenide, polyimide, such as Kapton, PI-2611, or similar commercial material, or metal, such as aluminum. The dielectric layer material can be any organic material, including polyimide, such as PI-2611, Durimide 9005, or similar commercial material, benzo-cyclobutene (BCB), such as Cyclotene 4024, poly methyl-methacrylate (PMMA), liquid crystal polymer (LCP), etc. Table 1 illustrates sample combinations of adhesion-diminishing treatment and different materials for carriers and dielectric layers used in the aforementioned embodiments. Table 2 illustrates sample combinations of different materials for carriers and dielectric layers in the aforementioned embodiments without adhesive treatment. It is to be noted that these tables are for illustrative purpose.

TABLE 1

Combination of adhesion-diminishing treatment and materials for carrier and dielectric layer

| Adhesion-diminishing treatment method | Carrier material | Dielectric layer material |
| --- | --- | --- |
| Coating VM651 (Silane) | PI-2611 | PI-2611 |
| | | Cyclotene 4024 |
| | | Durimide 9005 |
| High-temperature oxidation | Silicon wafer | PI-2611 |
| | | Cyclotene 4024 |
| Surfactant (Sodium dodecylbenzenesulfonate) | Silicon wafer | PI-2611 |
| | Glass | Cyclotene 4024 |
| | | Durimide 9005 |

TABLE 2

Combination of materials for carrier and dielectric layer without adhesive treatment

| Carrier material | Dielectric layer material |
| --- | --- |
| Silicon wafer | PI-2611 |
| | Cyclotene 4024 |
| PI-2611 | PI-2611 |
| | Cyclotene 4024 |
| | Durimide 9005 |

Material Selection and Process Principles

For the principle of selecting or processing materials of the carrier and dielectric layer to control adhesion as described in the invention, one is referred to the adhesion theory described in the following listed documents:
1. Berg, J. C., "Wettability" Marcel Dekker, Inc., New York, 1993.
2. Fowkes, F. M., "Contact Angle, Wettability, and Adhesion" American Chemical Society, Washington, D.C., 1964.
3. Shiue, J. H., "The complete book of Adhesives", Gaulih, Taipei, 1985.

The theory explains three criteria for adhesion: wetting, solidification, and sufficient deformation for reducing elastic pressure during bonding, and by keeping these three principles in mind one can select and control adhesion to get the effect needed by the invention; the three principles will be described in detail.

For wetting, one is referred to Cooper & Nuttall theory, wherein the criteria for wetting the surface of a solid s with a liquid 1 is:

$S = \gamma s - \Gamma 1 - \gamma s 1$

Wet: $S > 0$

Not wet: $S < 0$ $\gamma s$ = Interface free energy between the solid and saturated vapor
$\gamma 1$ = Interface free energy between the liquid and saturated vapor
$\gamma s 1$ = Interface free energy between the solid and the liquid
$S$ = Initial diffusion coefficient The material of a dielectric layer formed by coating can be selected based on the wetting principle, where the final adhesion is stronger when the S value is larger and the final adhesion is weaker when the S value is smaller. Material selected based on the principle can achieve the adhesion result required by the invention, and as well, surface treatment can be used to suitably change free energy, or enhancing or diminishing the adhesiveness of the layer, to achieve the adhesion result required by the invention. Because the actual value of the adhesion is greatly affected by process quality, persons skilled in the art should understand that the principle is a qualitative result and that the actual S value is not to be used for specific applications. However, by trial and error, a suitable adhesion between the carrier and the dielectric layer in the invention can be obtained, and thus the effect of natural separation as suggested by the invention can be achieved.

The wetting principle also applies to dielectric layers formed by non-coating methods like lamination and cold forging because plastic flow would form at the microscopic contact points. And since the invention must be solid, it naturally conforms to the solidification principle.

Dielectric layers formed by non-coating methods also need to fully consider the deformation principle. If the contact surface can completely deform during processing, the adhesion would be stronger, otherwise it would be weaker. By appropriately utilizing these principles, the natural separation effect of the invention can be achieved.

While the invention has been described by way of examples and in terms of the preferred embodiments, it is to be understood that the invention is not limited to the disclosed embodiments. In other words, it is intended to include equivalent modifications and changes of the above embodiments without departing from the spirit and scope of the invention as would be apparent to those skilled in the art. Therefore, the scope of the appended claims should be accorded the broadest interpretation so as to encompass all such equivalent modifications and changes.

What is claimed is:
1. A method of manufacturing a structure combining an IC integrated substrate and a carrier, comprising:
   providing a carrier; and
   forming an IC integrated substrate on the carrier, the IC integrated substrate having a first dielectric layer attached to the carrier, and the step of forming the IC integrated substrate comprises:
   forming the first dielectric layer on the carrier;
   forming at least one semiconductor device on the first dielectric layer; and
   performing an adhesion-enhancing treatment to the interface between the first dielectric layer and the at least one semiconductor device;
   wherein the materials of the carrier and the first dielectric layer are selected such that, through adhesion between the carrier and the first dielectric layer, the IC integrated substrate does not peel off from the carrier during processing but separates therefrom after being cut.
2. The method of manufacturing a structure combining an IC integrated substrate and a carrier as described in claim 1, wherein the IC integrated substrate being cut is separated from the carrier by sticking with tape, clamping with fixtures, or vacuum suction.

3. The method of manufacturing a structure combining an IC integrated substrate and a carrier as described in claim 1, wherein no adhesive treatment is performed to the interface between the carrier and the first dielectric layer.

4. The method of manufacturing a structure combining an IC integrated substrate and a carrier as described in claim 1, further comprising:
performing an adhesion-diminishing treatment to the interface between the carrier and the first dielectric layer.

5. The method of manufacturing a structure combining an IC integrated substrate and a carrier as described in claim 1, wherein the IC integrated substrate comprises a multilayer interconnection structure, and the step of forming the IC integrated substrate comprises:
forming at least one dielectric layer, which comprises the first dielectric layer; and
forming at least one metal layer;
wherein the at least one dielectric layer and the at least one metal layer are alternately formed on the carrier.

6. The method of manufacturing a structure combining an IC integrated substrate and a carrier as described in claim 5, wherein the step of forming the IC integrated substrate further comprises:
performing an adhesion-enhancing treatment to the interface between adjacent dielectric layers of the multilayer interconnection structure.

7. A method of manufacturing electronic devices, comprising:
providing a carrier;
forming an IC integrated substrate on the carrier, the IC integrated substrate having a first dielectric layer attached to the carrier, and the step of forming an IC integrated substrate comprises:
forming the first dielectric layer on the carrier;
forming at least one semiconductor device on the first dielectric layer; and
performing an adhesion-enhancing treatment to the interface between the first dielectric layer and the at least one semiconductor device, and said method of manufacturing electronic devices further comprising:
cutting at least one piece from the IC integrated substrate, so that each piece cut from the IC integrated substrate separates from the carrier to form an electronic device;
wherein the materials of the carrier and the first dielectric layer are selected such that, through adhesion between the carrier and the first dielectric layer, the IC integrated substrate does not peel off from the carrier during processing but separates therefrom after being cut.

8. The method of manufacturing electronic devices as described in claim 7, wherein the IC integrated substrate being cut is separated from the carrier by sticking with tape, clamping with fixtures, or vacuum suction.

9. The method of manufacturing electronic devices as described in claim 7, wherein no adhesive treatment is performed to the interface between the carrier and the first dielectric layer.

10. The method of manufacturing electronic devices as described in claim 7, further comprising:
performing an adhesion-diminishing treatment to the interface between the carrier and the first dielectric layer.

11. The method of manufacturing electronic devices as described in claim 7, wherein the IC integrated substrate comprises a multilayer interconnection structure, and the step of forming an IC integrated substrate comprises:
forming at least one dielectric layer, which comprises the first dielectric layer; and
forming at least one metal layer;
wherein the at least one dielectric layer and the at least one metal layer are alternately formed on the carrier.

12. The method of manufacturing electronic devices as described in claim 11, wherein the step of forming an IC integrated substrate further comprises:
performing an adhesion-enhancing treatment to the interface between adjacent dielectric layers of the multilayer interconnection structure.

\* \* \* \* \*